US012588260B2

(12) United States Patent
Fornara et al.

(10) Patent No.: US 12,588,260 B2
(45) Date of Patent: Mar. 24, 2026

(54) RADIO FREQUENCY SWITCH

(71) Applicant: STMicroelectronics (Rousset) SAS, Rousset (FR)

(72) Inventors: Pascal Fornara, Pourrieres (FR); Christian Rivero, Rousset (FR); Franck Julien, La Penne sur Huveaune (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 603 days.

(21) Appl. No.: 18/094,023

(22) Filed: Jan. 6, 2023

(65) Prior Publication Data

US 2023/0223448 A1     Jul. 13, 2023

(30) Foreign Application Priority Data

Jan. 10, 2022    (FR) ...................................... 2200145

(51) Int. Cl.
| | |
|---|---|
| *H10D 64/01* | (2025.01) |
| *H01L 21/768* | (2006.01) |
| *H01L 23/532* | (2006.01) |
| *H10D 62/83* | (2025.01) |
| *H10D 64/62* | (2025.01) |
| *H01L 23/522* | (2006.01) |

(52) U.S. Cl.
CPC ....... *H10D 64/01* (2025.01); *H01L 21/76843* (2013.01); *H01L 21/76858* (2013.01); *H01L 23/53266* (2013.01); *H10D 62/83* (2025.01); *H10D 64/62* (2025.01); *H01L 23/5226* (2013.01)

(58) Field of Classification Search
CPC .. H10D 64/01; H10D 64/62; H01L 23/53266; H01L 2221/1068; H01L 2221/1073
See application file for complete search history.

(56) References Cited

U.S. PATENT DOCUMENTS

| | | | |
|---|---|---|---|
| 2009/0149020 | A1 | 6/2009 | Hayashi et al. |
| 2010/0244260 | A1 | 9/2010 | Hinomura |
| 2013/0299990 | A1 | 11/2013 | Chen |
| 2014/0284701 | A1* | 9/2014 | Korec .................. H10D 62/393 |
| | | | 438/155 |
| 2016/0343712 | A1* | 11/2016 | Xu ..................... H10D 84/0177 |
| 2017/0365555 | A1 | 12/2017 | Choi et al. |
| 2018/0090613 | A1* | 3/2018 | McGregor ........... H10D 64/021 |
| 2021/0119008 | A1* | 4/2021 | Takahashi ............ H10D 12/441 |
| 2023/0131403 | A1* | 4/2023 | Pritchard ........... H10D 30/6713 |
| | | | 257/369 |

OTHER PUBLICATIONS

INPI Search Report and Written Opinion for priority application, FR 2200145, report dated Aug. 30, 2022, 16 pgs.

* cited by examiner

*Primary Examiner* — Wasiul Haider
(74) *Attorney, Agent, or Firm* — Crowe & Dunlevy LLC

(57) ABSTRACT

A method of manufacturing a radio frequency switch includes the steps of: forming a first silicide layer on a second conductive or semiconductor layer; forming a third insulating layer on the first layer; forming a cavity in the third insulating layer reaching the first silicide layer; forming a fourth metal layer in the cavity in contact with the first silicide layer; performing a non-oxidizing annealing; and filling the cavity with a conductive material. The first silicide layer is provided on one or more of the gate, source, and drain of a transistor forming the radio frequency switch.

19 Claims, 1 Drawing Sheet

RADIO FREQUENCY SWITCH

PRIORITY CLAIM

This application claims the priority benefit of French Application for Patent No. 2200145, filed on Jan. 10, 2022, the content of which is hereby incorporated by reference in its entirety to the maximum extent allowable by law.

TECHNICAL FIELD

The present disclosure generally concerns radio frequency switches and their manufacturing methods.

BACKGROUND

A switch is an electronic component or device allowing or not the connection between two nodes of a circuit. A radio frequency switch is a switch configured for switching, that is, for alternating between off and on states, at a frequency in the radio frequency range.

There is a need in the art to overcome all or part of the disadvantages of known radio frequency switches.

SUMMARY

An embodiment provides a method of manufacturing a device comprising a radio frequency switch, the method comprising: forming a first silicide layer on a second conductive or semiconductor layer; forming a third insulating layer on the first layer; forming in the third insulating layer of a cavity reaching the first silicide layer; forming a fourth metal layer in the cavity in contact with the first silicide layer; performing a non-oxidizing annealing; and filling of the cavity with a conductive material.

According to an embodiment, the switch is a transistor.

According to an embodiment, the second conductive or semiconductor layer is one of the elements among the drain region of the transistor, the source region of the transistor, and the gate of the transistor.

According to an embodiment, the switch is capable of switching at a frequency greater than 100 MHz.

According to an embodiment, the fourth metal layer entirely covers the walls and the bottom of the cavity.

According to an embodiment, the first silicide layer is made of a silicon and cobalt alloy.

According to an embodiment, the fourth metal layer is made of titanium.

According to an embodiment, the conductive material is tungsten.

According to an embodiment, steps of forming the fourth metal layer and performing the non-oxidizing annealing are separated a step of forming a fifth conductive layer covering the fourth metal layer.

According to an embodiment, the fifth conductive layer is made of titanium nitride.

According to an embodiment, the non-oxidizing annealing is performed in nitrogen.

According to an embodiment, the duration of the non-oxidizing annealing is in the range from 30 seconds to 10 minutes.

According to an embodiment, the non-oxidizing annealing is performed at a temperature in the range from 700° C. to 800° C.

According to an embodiment, the non-oxidizing annealing is performed at a temperature substantially equal to 765° C. for substantially 30 seconds.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figures 1, 2, 3, 4:
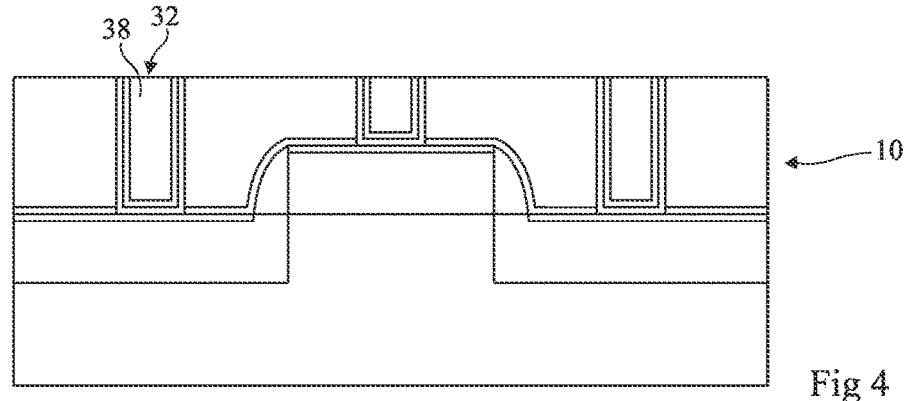
FIG. 1 schematically shows an example of a device comprising a radio frequency switch.
FIG. 2 shows a device after a step of an implementation mode of a method of manufacturing a device of the type of the device of FIG. 1.
FIG. 3 shows a device after another step of an implementation mode of a method of manufacturing a device of the type of the device of FIG. 1.
FIG. 4 shows a device after another step of an implementation mode of a method of manufacturing a device of the type of the device of FIG. 1.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

FIG. 1 schematically and at least partially shows an example of a device comprising a radio frequency switch 10. The device is for example a switch. The device for example comprises a plurality of switches such as switch 10. Switch 10 is, in the example of FIG. 1, a transistor, for example a metal oxide semiconductor field effect transistor (MOSFET).

Transistor 10 is formed in a semiconductor substrate 12 made, for example, of silicon. Substrate 12 is, for example, a bulk type substrate or a semiconductor on insulator (SOI) type substrate.

The substrate 12 comprises a doped well 14 of a first conductivity type, for example, of P type. Doped regions 16 and 18 of a second conductivity type, for example, of N type, are formed in well 14. Regions 16 and 18 are flush with an upper surface of substrate 12. Regions 16 and 18 form the source and drain regions of transistor 10. Regions 16 and 18 are separated by a doped region 20 of well 14 of the first conductivity type. Region 20 forms a channel region of transistor 10.

Transistor 10 further comprises a gate 22, resting on the substrate. Gate 22, for example, comprises an insulating layer, or gate insulator, in contact with region 20 and a block of conductive material made, for example, of polysilicon that is resting on the gate insulator and is separated from region 20 by the gate insulator.

Transistor 10 comprises spacers 24 covering the lateral walls of gate 22. The spacers partially cover regions 16 and 18.

Transistor 10 is covered with a layer 26 of insulator. Layer 26 is made of a dielectric material (for example, made of silicon oxide or silicon nitride).

Layer 26 is crossed by vias, or contacts, 28. Regions 16, 18 and gate 22 are each in contact with a contact 28, to be able to receive a voltage. Contacts 28 enable to couple the different portions of the transistor, that is, the gate, the drain, and the source, to nodes of application of voltages.

Transistor 10 is a radio frequency switch. In other words, transistor 10 is capable of operating at a frequency in the radio frequency range. In other words, transistor 10 is capable of switching, that is, of alternating between the on and off states, at a frequency in the radio frequency range. By radio frequencies, there is meant frequencies greater than 100 MHz, for example, in the range from 100 MHz to 300 GHz, for example, from 100 MHz to 10 GHz.

During the operation of a switch such as that of FIG. 1, the efficiency of the switch is conditioned by two operating criteria. One of these criteria is the intrinsic resistance Ron of transistor 10. The other criterion is the intrinsic capacitance Coff of transistor 10.

A low value of resistance Ron allows for a fast switching of the switch. A low value of capacitance Coff enables to limit leakages when the transistor is off. In the case of a radio frequency switch, it is thus desired to form transistors having low values of these criteria. In particular, it is desired to form transistors having a low resistance Ron to withstand a switching frequency in the radio frequency range.

FIGS. 2 to 4 show steps, preferably successive, of a method of manufacturing a device of the type of the device of FIG. 1.

FIG. 2 shows a device after a step of an implementation mode of a method of manufacturing a device of the type of the device of FIG. 1.

During this step, switch 10 is formed. In other words, substrate 12 is doped to obtain source and drain regions 16, 18 and channel region 20. Further, gate 22 is formed on region 20. Spacers 24 are formed on lateral walls of gate 22.

Silicide layers 29 are then formed in the semiconductor or conductive materials, that is, in regions 16, 18 and in gate 22. Layer 29 is, for example, made of a silicon and cobalt alloy, for example $CoSi_2$. In regions 16 and 18, silicide layers 29 are located at the level of the upper surface of substrate 12. In other words, layers 29 are flush with the upper surface of substrate 12. In gate 22, layer 29 is located at the level of the upper surface of the gate conductor, which as noted above is preferably made of polysilicon.

The forming of silicide layers 29 comprises, for example, the deposition of a layer, not shown, comprising the chemical component present in the silicide with the silicon. For a silicide made of a silicon and cobalt alloy, said layer is made of cobalt. Said layer preferably covers the entire structure, and in particular covers regions 16 and 18 and gate 22. The forming of layers 29 then comprises performing an annealing to cause the reaction of the cobalt with the silicon of regions 16 and 18 and of the gate polysilicon, to form silicide layers 29. The residual layers, not shown, are then removed, for example, by a selective etching.

A protection layer 30 is then formed on the structure. Layer 30 is, for example, made of an electrically-insulating material (for example, silicon nitride). Layer 30 covers, in particular, regions 16 and 18. Layer 30 also covers gate 22 and spacers 24, in particular the upper surface of gate 22.

Layer 26 is then formed on layer 30. Layer 26 covers in particular the portions of layer 30 located opposite regions 16 and 18 and gate 22.

Cavities 32 are then formed in layer 26 and in layer 30 at the level of the locations of contacts 28. Cavities 32 cross layer 26 and layer 30, from an upper surface of layer 26 to a lower surface of layer 30 in contact with layer 29. Thus, the bottom of cavities 32 is formed by portions of layers 29. Cavities 32 thus expose layer 29 at the locations of each contact 28.

FIG. 3 shows a device after another step of an implementation mode of a method of manufacturing a device of the type of the device of FIG. 1.

During this step, a stack of layers 34, 36 is conformally formed on the walls and the bottom of cavities 32. In other words, a layer 34 is conformally formed on the walls and the bottom of each cavity 32. Layer 34 is thus in contact with the lateral walls of each cavity 32 and with the portion of layer 29 located at the bottom of each cavity 32. A layer 36 is then conformally formed on the layer 34 located in each cavity 32.

Layer 34 is a metal layer, preferably made of a material reacting with the substrate during a thermal energy input, for example, of titanium. Layer 36 is a conductive layer, for example, a metal nitride layer, for example, a titanium nitride layer. Preferably, layer 36 is an alloy comprising the material of layer 34.

Layers 34 and 36 are, for example, formed over the entire structure, the portions located outside of cavities 32 then being removed.

The step of FIG. 3 then comprises performing a non-oxidizing annealing. This non-oxidizing annealing step causes a reaction between the layer 34 and the layer 29 of each cavity. In other words, the chemical elements of silicide layer 29 and of metal layer 34 intermix to form an alloy region, which decreases the resistance between layer 36 and the region having the contact arranged thereon, that is, region 16, 18 or gate 22.

The non-oxidizing annealing step is a step of heating of the device in a non-oxidizing gaseous environment. In other words, the space having the device located therein during the non-oxidizing annealing only comprises non-oxidizing gases, for example, inert gases only. For example, the non-oxidizing annealing is performed in an environment only comprising nitrogen.

The presence of an oxidizing gas during the annealing would cause the oxidation of layers 34 and 36 and would increase the resistance between layer 36 and the region having the contact located thereon.

Preferably, the duration of the non-oxidizing annealing is in the range from 30 seconds to 10 minutes, for example, from 30 seconds to 3 minutes. A non-oxidizing annealing of longer duration would cause a significant risk of modifying the dopant concentrations in the substrate.

Preferably, the temperature of the non-oxidizing annealing is in the range from 700° C. to 800° C. A non-oxidizing annealing performed at a higher temperature would cause a significant risk of damaging layer 26 and of making it less insulating.

The non-oxidizing annealing is, for example, performed in nitrogen ($N_2$), at a temperature substantially equal to 765° C. and for a duration substantially equal to 30 seconds.

FIG. 4 shows a device after another step of an implementation mode of a method of manufacturing a device of the type of the device of FIG. 1.

During this step, cavities 32 are filled, preferably totally, with a conductive material 38, for example, with a metal, for example, tungsten.

As a variant, one or a plurality of contacts 28 may be formed by a different manufacturing method. Thus, at least a first contact among the contact opposite gate 22, the contact opposite the drain, and the contact opposite the source is formed according to a previously-described implementation mode comprising the non-oxidizing annealing step between the forming of layer 36 and the filling of the cavity with material 38, the other contact(s) being formed by a method which does not comprise said non-oxidizing annealing. The other contact(s) are then preferably formed after the forming of the first contact(s).

An advantage of the described embodiments is that they enable to decrease resistance Ron when the switch operates in radio frequency mode, that is, when the switch switches at a frequency in the radio frequency range. Resistance Ron is not modified when the switch does not switch.

It is noted that when the switch is subjected to a parametric test, no difference on the intrinsic resistance Ron is observed in comparison with a known switch, only on the access resistance. However, when a measure in frequency is made on the switch, a decrease of 9% of the intrinsic resistance Ron is observed in comparison with a known switch. The effect of the stuffing barrier can therefore only be observed in frequency. The improved operation of the switch at radio frequencies is attributed use of the temperature and duration values for the annealing step described above which enable the formation of the alloy region that decreases access resistance when the transistor switch is controlled for switching at a frequency in the radio frequency range.

A surprising advantage of the described embodiments is that capacitance Coff is decreased.

Various embodiments and variants have been described. Those skilled in the art will understand that certain features of these various embodiments and variants may be combined, and other variants will occur to those skilled in the art. In particular, although the switch described in the drawings is a transistor and the embodiments are particularly advantageous for transistors, the described method may be used to form contacts of other elements of a radio frequency switch, for example, diodes, bipolar transistors, etc.

Finally, the practical implementation of the described embodiments and variations is within the abilities of those skilled in the art based on the functional indications given hereabove.

The invention claimed is:

1. A method of manufacturing a device comprising a radio frequency switch, the method comprising:
   (a) forming a first silicide layer on a second conductive or semiconductor layer;
   (b) forming a third insulating layer on the first silicide layer;
   (c) forming a cavity in the third insulating layer that extends to reach the first silicide layer;
   (d) forming a fourth metal layer in the cavity in contact with the first silicide layer;
   (e) performing a non-oxidizing annealing of the fourth metal layer in the cavity in contact with the first silicide layer for a duration of time in a range from 30 seconds to 10 minutes and at a temperature in a range from 700° C. to 800° C. in order to form an alloy of the fourth metal layer and the first silicide layer suited to decrease access resistance for the radio frequency switch for switching operations at radio frequencies; and
   (f) filling the cavity with a conductive material in contact with said alloy.

2. The method according to claim 1, wherein the radio frequency switch is a transistor.

3. The method according to claim 2, wherein the second conductive or semiconductor layer is an element of the transistor selected from the group consisting of: a drain region of the transistor, a source region of the transistor, and a gate of the transistor.

4. The method according to claim 1, wherein the switching operations at radio frequencies are performed at a frequency greater than 100 MHz.

5. The method according to claim 1, where the fourth metal layer entirely covers walls and a bottom of the cavity.

6. The method according to claim 1, wherein the first silicide layer is made of a silicon and cobalt alloy.

7. The method according to claim 1, wherein the fourth metal layer is made of titanium.

8. The method according to claim 1, wherein the conductive material is tungsten.

9. The method according to claim 1, wherein steps (d) and (e) are separated by forming a fifth conductive layer covering the fourth metal layer.

10. The method according to claim 9, wherein the fifth conductive layer is made of titanium nitride.

11. The method according to claim 1, wherein the non-oxidizing annealing is performed in nitrogen.

12. The method according to claim 1, wherein the non-oxidizing annealing is performed at a temperature substantially equal to 765° C. for substantially 30 seconds.

13. A method of manufacturing a device comprising a radio frequency switch, the method comprising:
   (a) forming a first cobalt-silicide layer on a second conductive or semiconductor layer;
   (b) forming a third insulating layer on the first cobalt-silicide layer;
   (c) forming a cavity in the third insulating layer that extends to reach the first cobalt-silicide layer;
   (d) forming a fourth titanium layer in the cavity in contact with the first cobalt-silicide layer;
   (e) performing a non-oxidizing annealing to cause an intermixing of chemical elements between the fourth titanium layer and the first cobalt-silicide layer to form an alloy region; and
   (f) filling the cavity with a conductive material in contact with the alloy region.

14. The method according to claim 13, wherein steps (d) and (e) are separated by forming a fifth titanium nitride layer covering the fourth titanium layer.

15. The method according to claim 13, wherein the radio frequency switch is a transistor.

16. The method according to claim 15, wherein the second conductive or semiconductor layer is an element of the transistor selected from the group consisting of: a drain region of the transistor, a source region of the transistor, and a gate of the transistor.

17. The method according to claim 13, wherein a duration of the non-oxidizing annealing is in a range from 30 seconds to 10 minutes.

18. The method according to claim 13, wherein the non-oxidizing annealing is performed at a temperature in a range from 700° C. to 800° C.

19. The method according to claim 13, wherein the non-oxidizing annealing is performed at a temperature substantially equal to 765° C. for substantially 30 seconds.

* * * * *